United States Patent
Taylor et al.

(10) Patent No.: US 7,366,021 B2
(45) Date of Patent: Apr. 29, 2008

(54) METHOD AND APPARATUS FOR SENSING FLASH MEMORY USING DELTA SIGMA MODULATION

(75) Inventors: Jennifer Taylor, Boise, ID (US); R. J. Baker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 11/121,114

(22) Filed: May 4, 2005

(65) Prior Publication Data
US 2006/0250853 A1     Nov. 9, 2006

(51) Int. Cl.
*G11C 11/34*     (2006.01)
(52) U.S. Cl. .............. 365/185.21; 365/185.33
(58) Field of Classification Search .......... 365/185.21, 365/185.29, 185.33, 158; 341/110, 144, 341/156
See application file for complete search history.

(56) References Cited
U.S. PATENT DOCUMENTS

| | | | |
|---|---|---|---|
| 5,600,319 A * | 2/1997 | Ginetti | 341/144 |
| 6,188,340 B1 * | 2/2001 | Matsumoto et al. | 341/110 |
| 6,490,200 B2 | 12/2002 | Cernea et al. | |
| 6,741,502 B1 * | 5/2004 | Cernea | 365/185.29 |
| 6,781,906 B2 * | 8/2004 | Perner et al. | 365/158 |
| 6,847,234 B2 * | 1/2005 | Choi | 341/156 |

OTHER PUBLICATIONS

R. J. Baker, "Delta-Sigma Modulation for Sensing", Boise State University, College of Engineering, pp. 1-36, Apr. 16, 2004.

* cited by examiner

*Primary Examiner*—Trong Phan
(74) *Attorney, Agent, or Firm*—Dickstein Shapiro LLP

(57) ABSTRACT

A simple method and device for accurately measuring flash memory cell current. The sensing scheme comprises an integrator, an analog to digital converter, and a digital to analog converter. The method comprises the acts of applying an input current and a feedback output current to a summer, integrating the resulting summer output over time, passing the integrated output to a clocked comparator, outputting a comparator output which controls a feedback circuit that keeps the integrator's voltage at the same level as a reference voltage, and outputting a digital average current to a counter. Delta sigma modulation (averaging) is employed to cancel out noise that would otherwise affect the cell current measurement.

39 Claims, 7 Drawing Sheets

| TIME (ns) 1002 | CAP VOLTAGE 1004 | COMPARATOR OUTPUT 1006 | MEASURED DISCHARGE RATE (RUNNING AVERAGE) 1008 |
|---|---|---|---|
| 10 | 3.75 | 0 | 0.00 |
| 20 | 3.50 | 0 | 0.00 |
| 30 | 3.25 | 0 | 0.00 |
| 40 | 3.00 | 1 | 0.25 |
| 50 | 3.75 | 0 | 0.20 |
| 60 | 3.50 | 0 | 0.17 |
| 70 | 3.25 | 0 | 0.14 |
| 80 | 3.00 | 1 | 0.25 |
| 90 | 3.75 | 0 | 0.22 |
| 100 | 3.50 | 0 | 0.20 |
| 110 | 3.25 | 0 | 0.18 |
| 120 | 3.00 | 1 | 0.25 |
| 130 | 3.75 | 0 | 0.23 |
| 140 | 3.50 | 0 | 0.21 |
| 150 | 3.25 | 0 | 0.20 |
| 160 | 3.00 | 1 | 0.25 |
| 170 | 3.75 | 0 | 0.24 |
| 180 | 3.50 | 0 | 0.22 |
| 190 | 3.25 | 0 | 0.21 |
| 200 | 3.00 | 1 | 0.25 |

FIG. 10

METHOD AND APPARATUS FOR SENSING FLASH MEMORY USING DELTA SIGMA MODULATION

The invention relates generally to semiconductor memory consisting of floating gate devices such as flash, electrically programmable read-only memory (EPROM), electrically eraseable programmable read-only memory (EEPROM) and flash EEPROM, and specifically to circuits and techniques for reading and sensing their memory states.

BACKGROUND OF THE INVENTION

Non-volatile memories, such as EEPROM or flash memories, are widely used in portable devices including devices lacking a mass data storage device and a fixed source of power, such as cellular phones, handheld personal computers (PCs), portable music players and digital cameras. These memories can be erased and have new data written or "programmed" into their memory cells for long term storage. Flash memories are also commonly used to hold boot code in PC's, as well as used in servers, networks, and set top boxes.

A floating gate memory cell employs a floating conductive gate, within a transistor structure, but unconnected and positioned over a channel region in a semiconductor substrate, between source and drain regions. A control gate is provided over the floating gate. The threshold voltage characteristic of the transistor is controlled by the amount of charge that is retained on the floating gate. That is, the minimum amount of voltage (threshold) that must be applied to the control gate before the transistor is turned "on" to permit conduction between its source and drain regions is controlled by the level of charge on the floating gate.

A floating gate memory cell can be programmed to any threshold voltage level within a threshold voltage window because the floating gate can retain a range of charge. The size of the threshold voltage window, limited to the minimum and maximum threshold levels of the device, depends on the characteristics of the device, operating conditions and the device's history. Each distinct, resolvable threshold voltage level within the window may, in principle, be used to designate a definite memory state of the cell.

In practice, the memory state of a floating gate memory cell is usually read by a sense amplifier circuit by sensing the conduction current across the source and drain electrodes of the cell when a reference voltage is applied to the control gate. Thus, for each given charge on the floating gate of a cell, a corresponding threshold voltage may be detected, or equivalently, a corresponding conduction current with respect to a reference control gate voltage may be detected. Likewise, the range of charge programmable onto the floating gate defines a corresponding threshold voltage window or a corresponding conduction current window.

A conventional sense amplifier circuit includes a differential amplifier circuit that generally senses a voltage differential between the voltage appearing on a column line connected to a reference cell and the voltage appearing on a column line connected to an addressed memory cell. It also drives a sense output signal (that is coupled to the data output pins of the flash memory device) based upon the sensed voltage differential.

Conventional flash memory devices include a reference current generator that generates a reference current for use by the sense amplifier circuits. A current mirror circuit in the flash memory device mirrors the reference current and applies a single mirrored reference current to all of the sense amplifiers. A startup circuit is utilized in some existing flash memory devices in order to provide a fast settling time of the reference node appearing at the input of the sense amplifiers. An existing startup circuit includes first and second discharge current stages, with each discharge current stage discharging the charge appearing at the reference node input of the sense amplifiers based upon a bandgap reference current. Each discharge current stage utilizes feedback to gradually decrease the rate of discharge by the discharge current stage so that the discharge current stages are disabled by the time the voltage appearing at the reference node input of the sense amplifiers reaches the desired voltage level.

The known reference current generator, startup circuits and sense amplifiers, however, have shortcomings. For instance, the use of the reference current generator and corresponding current mirror circuit limits the number of sense amplifiers that may be utilized at one time. There is also the shortcoming that once the integrator discharges below a reference value, the integrator is connected directly to $V_{DD}$ and becomes fully charged. Since the $V_{DD}$ supply essentially provides an infinite amount of charge, each time the integrator is charged, the information previously stored by the integrator is lost. In addition, there is a relatively slow settling time of the reference voltage due to the large capacitive loading on the reference current generator/mirror circuit when a large number of sense amplifiers are used.

Accordingly, there is a need and desire for an improved sensing method and apparatus and to more effectively and accurately provide reference current levels to sense amplifiers in a nonvolatile memory device, such as a flash memory device.

BRIEF SUMMARY OF THE INVENTION

The invention, as described in the exemplary embodiment, provides a simple method and apparatus for accurately sensing flash memory cell current by operating a sense amplifier circuit using delta sigma modulation that includes the acts of applying an input current and a feedback output current to a summer, integrating the resulting summer output over time by an integrator, passing the integrator output to a clocked comparator, outputting a comparator output which controls a feedback circuit that keeps the integrator's voltage at the same level as a reference voltage, and outputting a digital average current in the form of pulses to a counter. Feedback is employed in order to determine the average value of the flash cell current over a pre-determined amount of time. Errors due to noise are averaged out.

In one embodiment of the invention, the integrator is a capacitor that is charged by connection to a current source that deposits a set amount of charge to the capacitor. In this way, the capacitor integrates current over the entire sensing time, rather than over just one discharge cycle. Additionally, the delta sigma modulation cancels out the noise causing cell current fluctuations and provides a measurement of the average cell current. Use of delta sigma modulation in the sense amplifier alleviates the need for high precision circuitry that is necessary to provide noise immunity and accurate analog comparisons in conventional sense amplifiers.

BRIEF DESCRIPTION OF THE DRAWINGS

The foregoing and other advantages and features of the invention will become more apparent from the detailed description of exemplary embodiments provided below with reference to the accompanying drawings in which:

FIG. 10 is a table of the results of an exemplary operation of the invention.

DETAILED DESCRIPTION OF THE INVENTION

Figure 1:
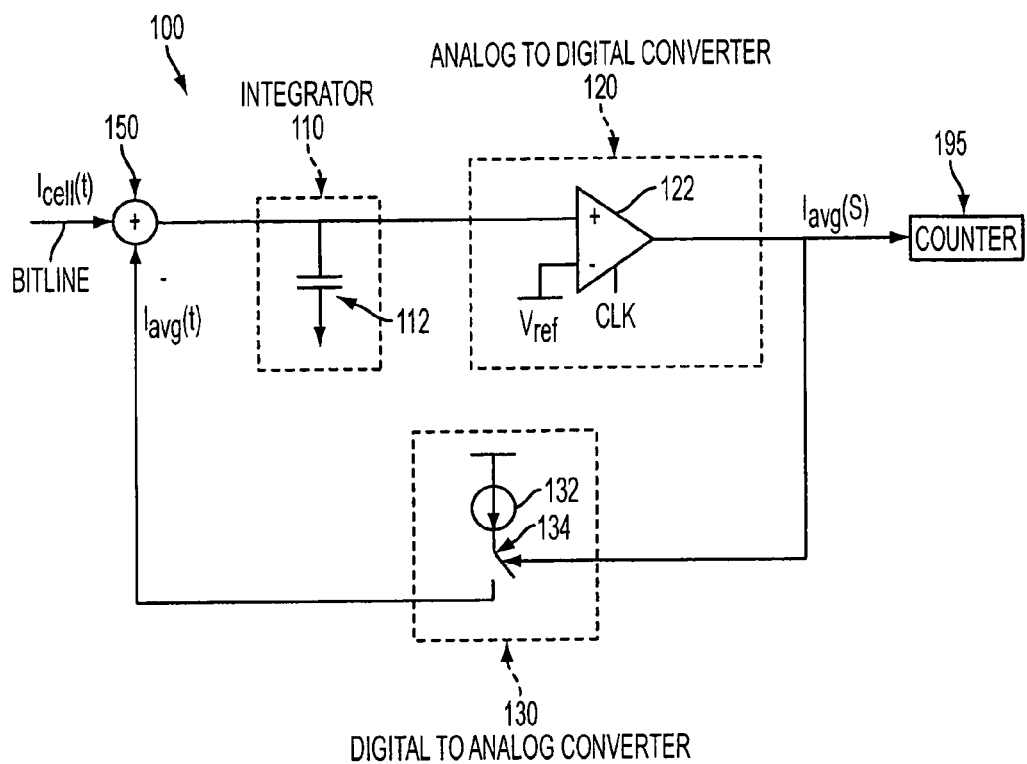
FIG. 1 is a block diagram of an exemplary embodiment of the invention.
Figure 2:
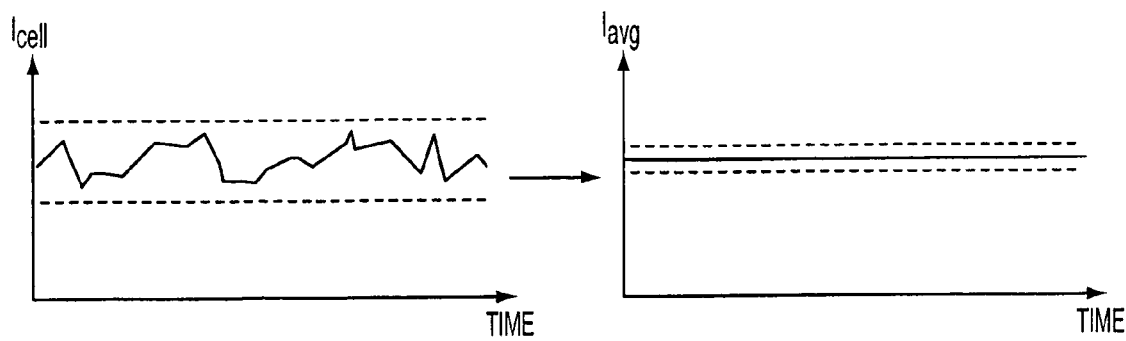
FIG. 2 is a plot illustrating examples of cell current input to the sense amplifier of the invention and a desired current output.
Figure 3:
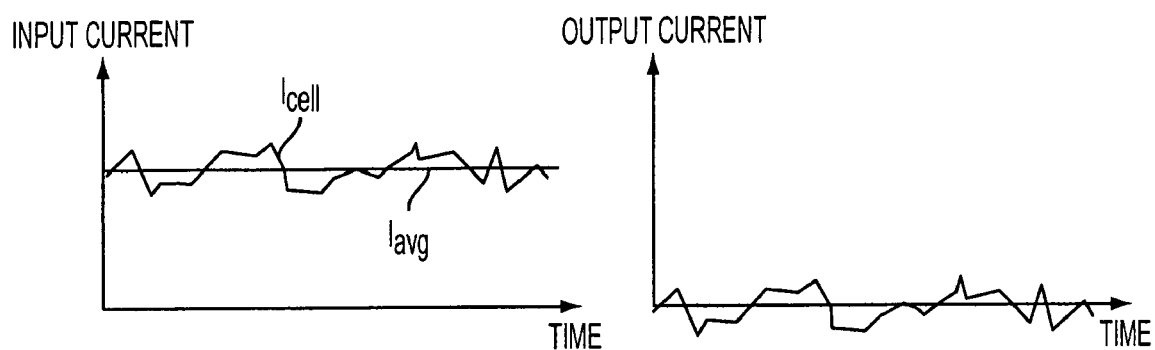
FIG. 3 is a plot illustrating examples of the inputs and output of the summer circuit illustrated in FIG. 1.

FIG. 1 illustrates a block diagram of a sense amplifier circuit 100 constructed in accordance with an exemplary embodiment of the invention. The circuit 100 comprises an integrator 110, an analog-to-digital converter 120 ("ADC"), and a digital-to-analog converter 130 ("DAC"). For this illustrated embodiment, the integrator 110 is implemented as a capacitor 112, the ADC 120 is implemented as a simple clocked comparator 122, and the DAC 130 is implemented as a current source 132 and switch 134 controlled by the output of the ADC 120. Referring also to FIGS. 2 and 3, the inputs to the circuit 100 are the flash cell current $I_{cell}$ and the previous average cell current output $I_{avg}$ from the DAC 130, both of which are shown in FIG. 2. The currents $I_{cell}$, $I_{avg}$, are combined at a summer 150. FIG. 2 illustrates examples of cell current input to the sense amplifier of the exemplary invention and the desired current output. The flash cell current $I_{cell}$ varies with time due to adjacent circuit noise, capacitive coupling, $V_{DD}$/ground bounce, etc. Because of the cell current fluctuations, wide margins are required between memory states. The average flash cell current $I_{avg}$ has a much narrower range of fluctuation. The possible range of fluctuations of the $I_{cell}$ and $I_{avg}$ currents in a single memory state is indicated by the set of dotted lines in both plots of FIG. 2. FIG. 2 shows the reduction in the range of fluctuation between $I_{cell}$ and $I_{avg}$ currents. As shown in FIG. 3, the summer 150 computes the difference between the $I_{cell}$ and $I_{avg}$ currents.

Figure 4:
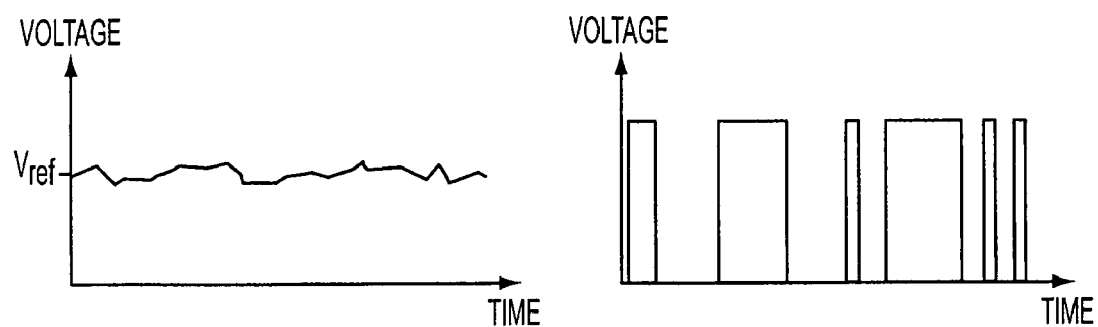
FIG. 4 is a plot illustrating examples of the input and output of the comparator illustrated in FIG. 1.

Referring now to FIGS. 1 and 4, the output of the summer 150 is integrated over time by the capacitor 112. The capacitor 112 voltage is fed to one input of the clocked comparator 122. The clocked comparator's output $I_{avg(s)}$ toggles high and low to keep the capacitor's 112 voltage at the same level as the referenced voltage $V_{ref}$. The comparator 122 output $I_{avg(s)}$ is a digital representation of the average current $I_{avg(t)}$. In a desired embodiment, the integrator 110 consists simply of the bitline capacitance of the flash memory array. While the bitline capacitance of a memory array will vary depending on cell design, process technology, and number of cells per column, the bitline capacitance is assumed to be 5 pF for this exemplary embodiment. The following description is made with reference to exemplary values and timings, yet it should be appreciated that the invention is not limited to these values. This capacitance is initially charged to a reference voltage of 0.5V, which is chosen to be close to the switching point of the clocked comparator 122. The voltage stored on the bitline capacitance does not need to be pre-charged, as the delta sigma sensing circuit 100 itself can charge the voltage stored on the bitline capacitance to the comparator switching point (discussed below); however, this would add some delay to the sensing operation.

At the beginning of the sensing operation, the flash cell current $I_{cell}$ begins to discharge the voltage of the bitline capacitance until the voltage at that node reaches the switching point of the comparator 122. Once the comparator 122 output switches, the DAC 130 (discussed in more detail below) feeds back sufficient current $I_{avg(t)}$ to cause the bitline capacitance voltage to charge back to a voltage level above the comparator 122 switching point. Expected discharge times for a few flash cell current $I_{cell}$ values are shown below, in Table 1, by solving:

$$I_{cell}/C_{cell} = \Delta V_{bitline}/T \qquad (1)$$

with $C_{cell}$=5 pF, and $\Delta V_{bitline}$=0.5V (complete discharge).

TABLE 1

| $I_{cell}$ | Discharge Time |
|---|---|
| 1 µA | 2.5 µs |
| 30 µA | 83 ns |
| 60 µA | 42 ns |

In order to avoid completely discharging the voltage stored on the bitline capacitance (and losing the benefit of averaging over time), the circuit 100 should not be allowed to discharge for more than 42 ns in one clock cycle, for a maximum flash cell current of 60 µA. For this exemplary embodiment, a 100 MHz clock is used, giving over 30 ns of margin. While the discharge rate of the capacitor 112 sets the minimum clock frequency, there is no limitation for maximum clock frequency.

It is worth noting that the voltage on the bitline, and consequently the voltage applied to the drain of the flash cell, will vary over time as the voltage on the capacitance charges and discharges around the comparator 122 switching point. This will cause the flash cell current $I_{cell}$ to fluctuate slightly. This is not a problem since the average value of the bitline capacitance voltage will be a constant, and the exemplary embodiment of FIG. 1 is seeking to determine the corresponding average value of the flash cell current.

Figure 5:
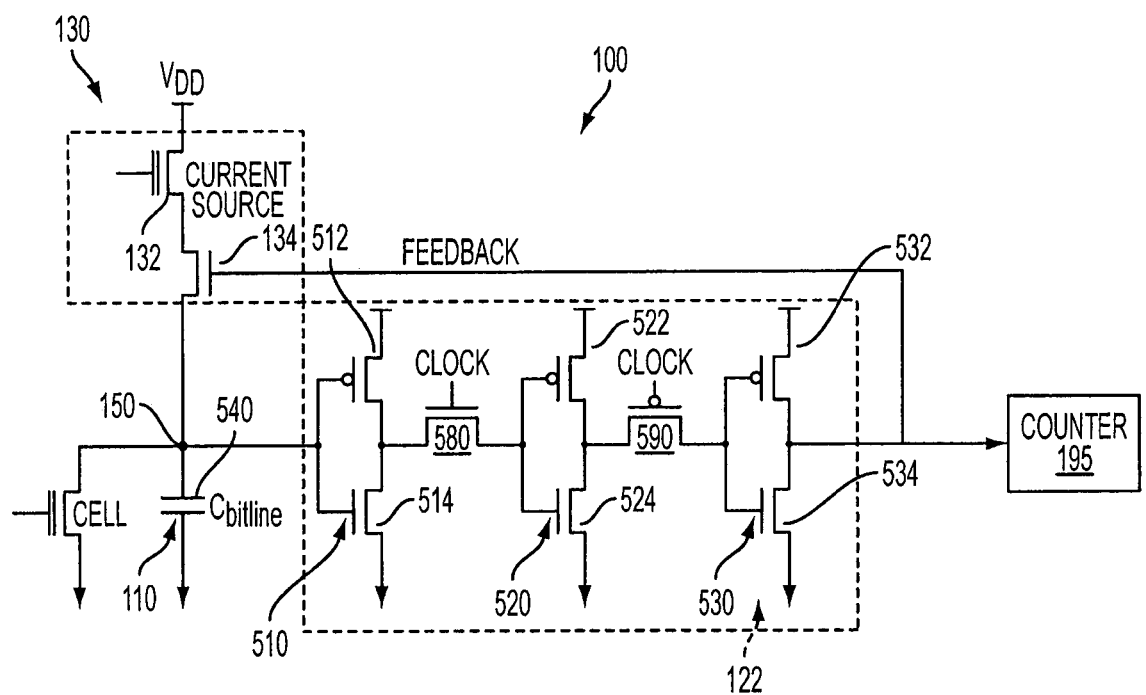
FIG. 5 is a schematic diagram of the exemplary embodiment illustrated in FIG. 1.

Referring now to FIG. 5, a more detailed circuit view of the sigma delta sense amplifier circuit 100 is now shown. The clocked comparator 122 consists of three inverters 510, 520, 530 and two switches 580, 590. This simple comparator 122 is used to illustrate the point that the comparator does not have to be very precise for the delta sigma noise shaping of the invention to work. The comparator 122 can occasionally make wrong decisions, and the error will average out over the sensing time.

Figure 6:
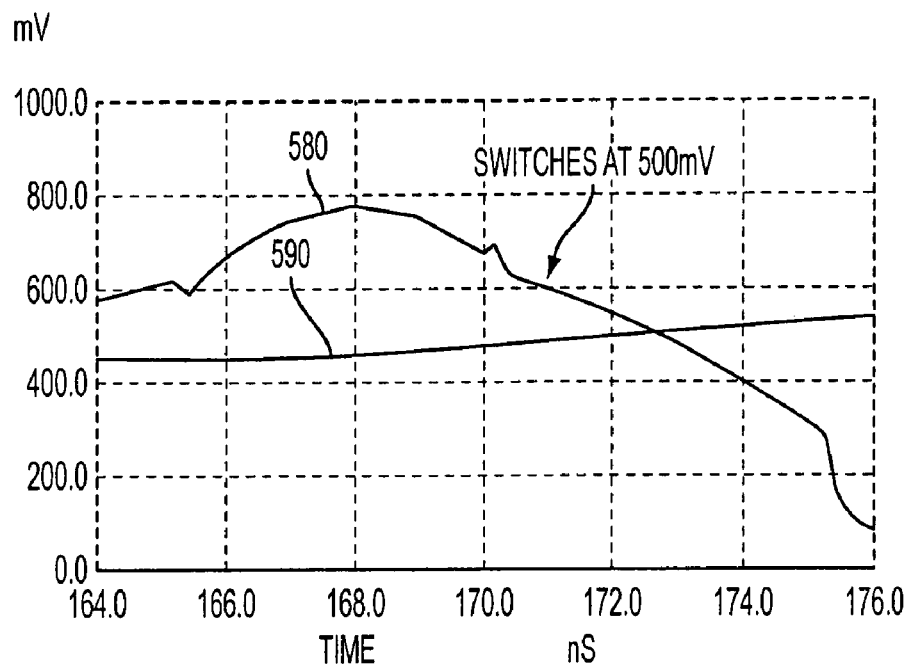
FIG. 6 is a graph showing a SPICE simulation showing the switching points of the comparator of FIG. 1.
Figure 7:
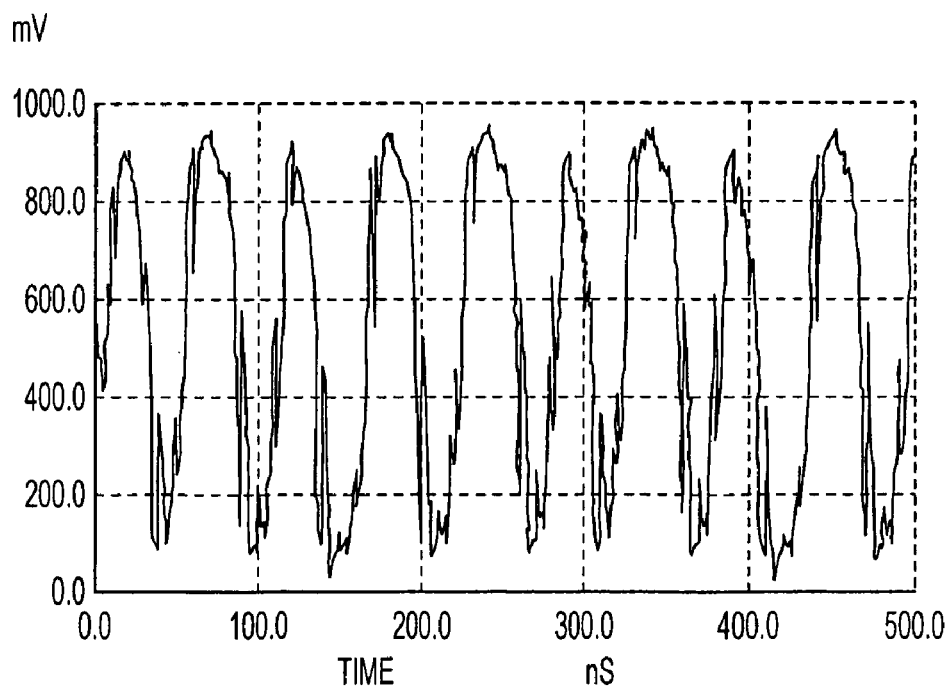
FIG. 7 illustrates an example of the voltage output of the first comparator stage.
Figure 8:
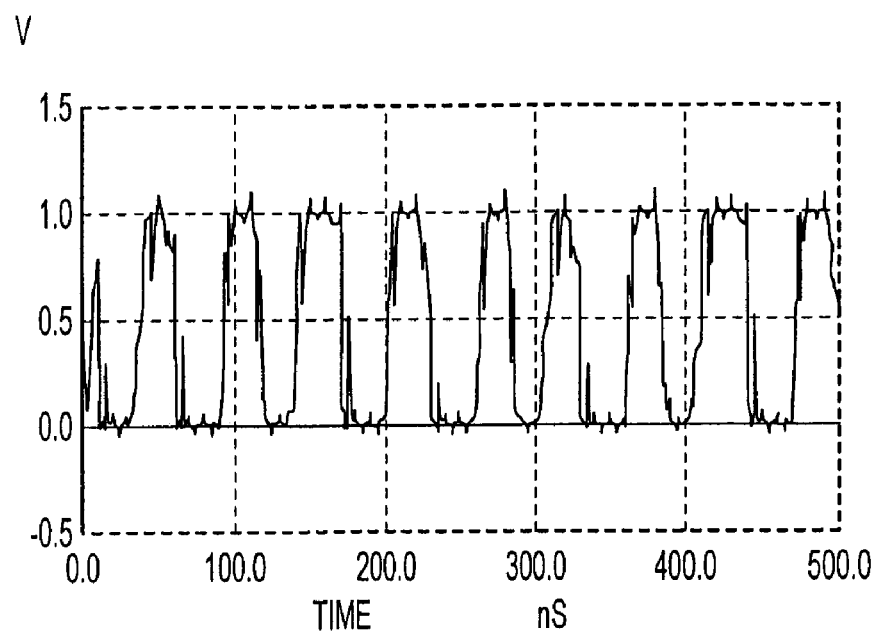
FIG. 8 illustrates an example of the voltage output of the second comparator stage.
Figure 9:
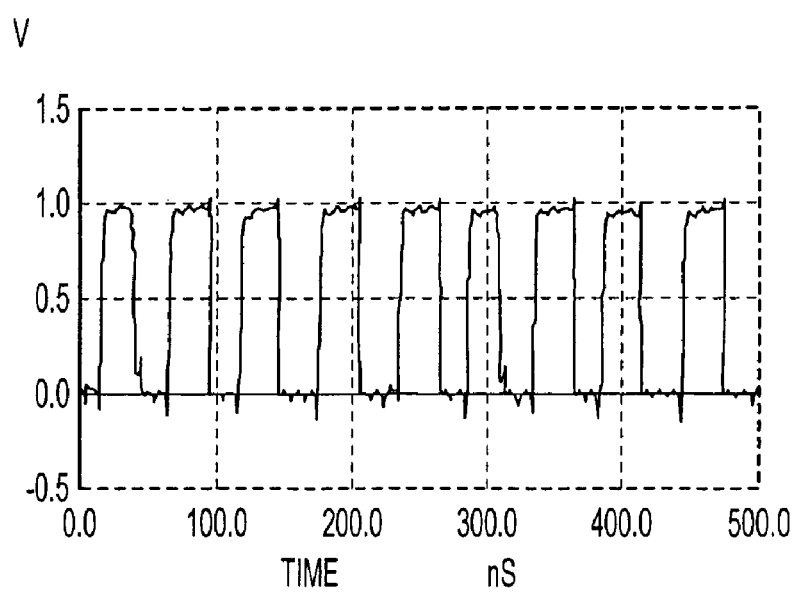
FIG. 9 illustrates an example of the voltage at the output of the third and final comparator stage.

In the illustrated example embodiment, the NMOS and PMOS switches 580, 590 are sized as 10/1 and 20/1 (the channel width to length ratio) respectively. The NMOS transistors 514, 524, 534 in the inverters 510, 520, 530 are sized as 10/10 and the PMOS transistors 512, 522, 532 are sized as 20/10. These transistors are made slightly long in order to keep power consumption lower. The comparator's 122 decision point will correspond to the switching point of the first inverter 510. In this embodiment, the switching point is approximately 0.5V, as shown in the SPICE simulation results in FIG. 6. The two switches 580, 590 controlled by the CLOCK signal act together to serve as an edge-triggered latch. The three inverters 510, 520, 530 provide sufficient gain to restore the output signal to full voltage levels. FIGS. 7-9 show the voltage after each inverter stage of the comparator 122.

In FIGS. 1 and 5, the output of the comparator 122 controls the feedback of DAC 130. The DAC 130 consists of a flash cell for the current source 132, and a transistor controlled by the output of the clocked comparator 122 serving as switch 134. When the sensing is initiated, the current source 132 is disconnected (switch 134 is opened) and the flash cell being sensed causes the voltage stored on the bitline capacitance $C_{bitline}$ 540 serving as the integrator 110 to discharge. Once the bitline capacitance voltage reaches the switching point of the clocked comparator 122, the feedback switch is enabled and the feedback current is connected to the bitline capacitance $C_{bitline}$ 540 at summer 150, causing it to be charged to a voltage level higher than the comparator switching point. This feedback action is the reason the comparator's output $I_{avg(s)}$ is equivalent to the average value of the input current $I_{avg(t)}$. Thus, the feedback current $I_{avg(s)}$ must be selected at a level at least as high as the highest flash cell current $I_{cell}$ expected. For this embodiment, a feedback current $I_{avg(s)}$ of 60 µA is selected, and the expected flash cell current $I_{cell}$ values will range from 0 µA to ~50 µA. The precise value of this current is not important, nor is it important to be consistent across a wafer.

For processing simplicity, a flash cell 132 is used in this embodiment for the feedback current source. This flash cell 132 would need to be erased to the desired level during wafer probe testing. Another choice for a feedback current source would be a switched capacitor. A switched capacitor would result in lower power, but requires two non-overlapping clock signals (which are not otherwise required), and may also require increased layout area.

In the exemplary embodiment, the sense amplifier 100 is clocked at 100 MHz. Thus, every 10 ns, there is a constant amount of charge $Q_{bit}$ removed from the bitline capacitance due to the current $I_{cell}$ from the flash cell being sensed. This charge $Q_{bit}$ can be calculated by:

$$Q_{bit}=I_{cell}T \quad (2)$$

For example, $Q_{bit}$ for a cell drawing 30 µA of current is 300 fC when T=10 ns.

The output $I_{avg(s)}$ of the delta sigma sense amplifier 100 (the digital output of the comparator 122), is fed to a counter 195 which generates a digital code associated with the $I_{avg(s)}$. Referring now to FIG. 10, the counter 195 will record the number of times the comparator output changes signals. FIG. 10 illustrates example values for the time (ns) 1002 of the relevant clock cycle, the capacitor voltage 1004, comparator output 1006 and measured discharge rate (running average) 1008 for this example. The times 1002 for this example are 10, 20, 30, 40, 50, 60, 70, 80, 90, 100, 110, 120, 130, 140, 150, 160, 170, 180, 190 and 200 ns. The associated capacitor output 1004 at these times are 3.75, 3.50, 3.25, 3.00, 3.75, 3.50, 3.25, 3.00, 3.75, 3.50, 3.25, 3.00, 3.75, 3.50, 3.25, 3.00, 3.75, 3.50, 3.25, 3.00. The comparator output 1006 is 0 for all times 1002 except at times 40 ns, 80 ns, 120 ns, 160 ns and 200 ns, where the output is 1. The associated measured discharge rates 1008 are 0.00, 0.00, 0.00, 0.25, 0.20, 0.17, 0.14, 0.25, 0.22, 0.20, 0.18, 0.25, 0.23, 0.21, 0.20, 0.25, 0.24, 0.22, 0.21, and 0.25. For instance, using the results of an example exemplary operation, the digital code associated with $I_{avg(s)}$ would be 5. The rate at which charge is added to the bitline capacitance by the feedback current $I_{avg(t)}$ is not constant during each clock cycle, since the feedback current $I_{avg(t)}$ is sometimes enabled and sometimes disabled. If the bitline capacitance voltage is less than the switching point of the comparator 122, then the DAC 130 will be enabled and the feedback current $I_{avg(t)}$ will be added to the bitline capacitance voltage for one clock cycle. If the bitline capacitance voltage is greater than the switching point of the comparator, 122 then the feedback circuit will be disabled, and the flash cell current $I_{cell}$ will continue to discharge the bitline capacitance voltage. A decision is made against the comparator switching point every clock cycle (every 10 ns). If N is the total number of clock cycles used in the sense operation, and M is the number of times the feedback current $I_{feedback(Iavg(s))}$ is enabled, then the charge $Q_{feedback}$ added to the bitline capacitance can be calculated as:

$$Q_{feedback}=I_{feedback} \cdot (M/N) \cdot T \quad (3)$$

If the circuit is operating properly, the average feedback current will equal the flash cell current so the equation becomes:

$$Q_{feedback}=I_{feedback} \cdot (M/N) \cdot T=Q_{bit}=I_{cell} \cdot T \quad (4)$$

$$(I_{cell}/I_{feedback})=(M/N) \quad (5)$$

$$I_{cell}=(M/N) \cdot I_{feedback} \quad (6)$$

where T is the clock period.

Using the above equations, the minimum $I_{cell}$ value that can be sensed, and the minimum resolution, corresponds to M=1 (one high output code during the entire sensing time). For this embodiment, the sensing time was selected as 5 µs, and the feedback current is 60 µA. Thus, the minimum resolution is:

$$(1/500) \cdot 60 \text{ µA}=120 \text{ nA} \quad (7)$$

The invention accurately measures flash memory cell current. The purpose of this invention is to determine the average of the flash cell current over time, allowing a reduction in margin and enabling the storing of multiple data bits per cell. Delta sigma modulation (averaging) is employed to cancel out noise that would otherwise affect the cell current measurement. Because of the delta sigma modulation and resulting noise cancellation, the circuit elements used in the comparator 122 do not have to be precise to achieve a highly accurate measurement. The measurement accuracy is directly proportional to the length of the sensing time and is essential for storing multiple bits of data within a single memory cell.

Figure 11:
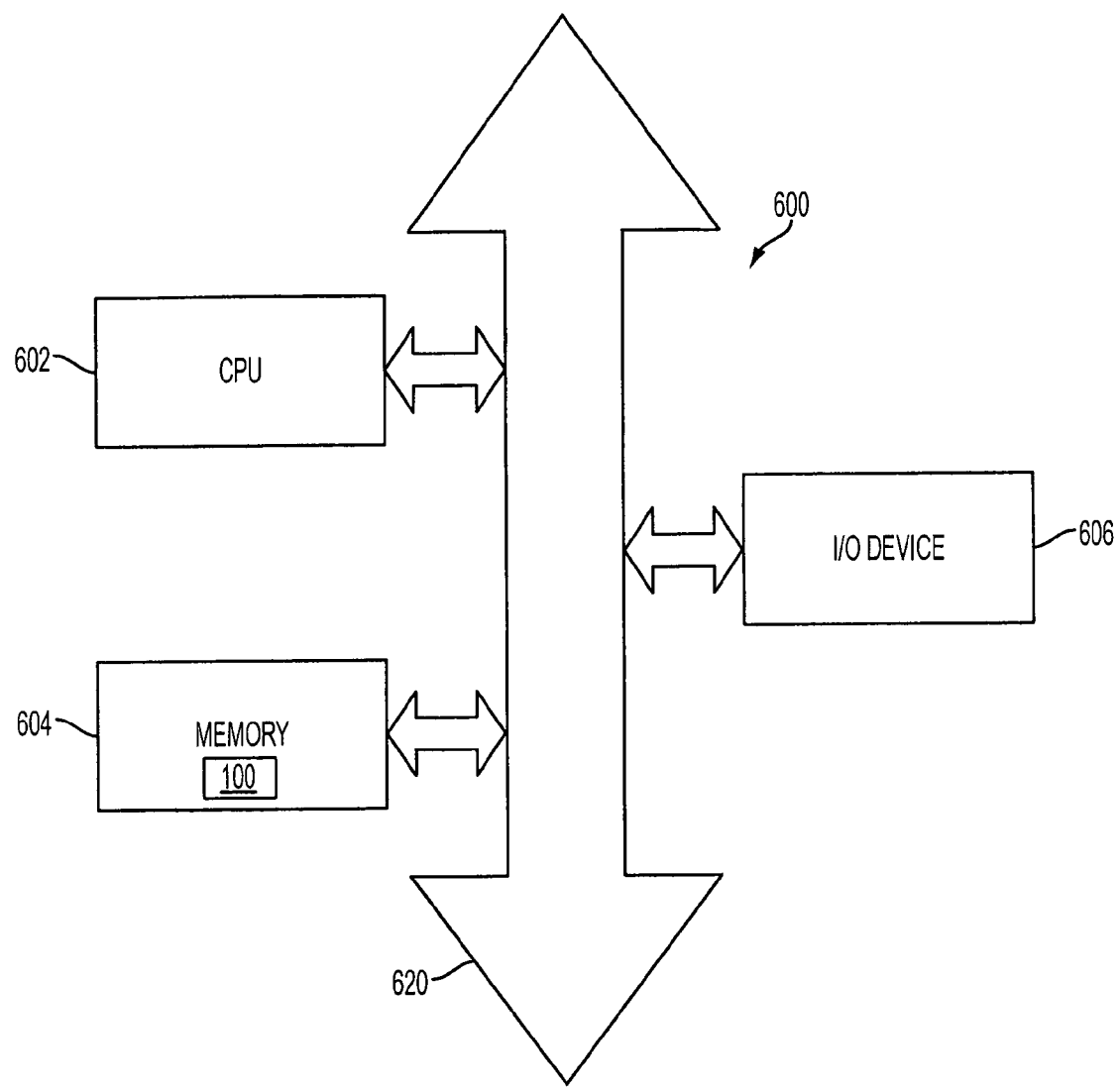
FIG. 11 illustrates a system including a memory device and sense amplifier of the invention.

FIG. 11 shows system 600, a typical processor based system modified to include a sense amplifier circuit 100 of the present invention. Examples of processor based systems, which may employ the sense amplifier circuit 100, include, without limitation, computer systems, camera systems, scanners, machine vision systems, vehicle navigation systems, video telephones, surveillance systems, auto focus systems, star tracker systems, motion detection systems, image stabilization systems, and others.

System 600 includes a central processing unit (CPU) 602 that communicates with various devices over a bus 620. Some of the devices connected to the bus 620 provide communication into and out of the system 600, illustratively including an input/output (I/O) device 606 and sense amplifier circuit 100. Other devices connected to the bus 620 provide memory, illustratively including a memory 604 incorporating the sense amplifier circuit 100 illustrated in FIG. 1. While one input/output device 606 is shown, there may be multiple I/O devices such as a CD-ROM, hard drive, floppy disk, display, and keyboard as well as others. The sense amplifier circuit 100 may also be combined with a processor, such as a CPU, digital signal processor, or microprocessor, in a single integrated circuit.

It should be noted that the invention has been described with reference to a Flash memory, where the state of the array cells is defined by how much current the array cells conduct, but it should be appreciated that the invention may be utilized with any type of memory array and not limited to, EPROM, EEPROM, or Flash. For example, resistance variable memory cells may be sensed with the present invention.

The processes and devices described above illustrate preferred methods of typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered.

What is claimed as new and desired to be protected by Letters Patent of the United States is:

1. A sense amplifier circuit comprising:
   a first circuit for summing a current from a memory cell and a feedback current to form a summed current;
   an integrator connected to receive the summed current and to integrate the summed current over a first time, said integrator being charged and discharged during the first time;
   an analog-to-digital converter connected to receive the integrated summed current and having a digital output corresponding to an average current and a count of a number of times said integrator is discharged during the first time; and
   a digital-to-analog converter connected to receive the digital average current and to output the feedback current to the first circuit.

2. The sense amplifier circuit of claim 1, wherein said integrator comprises a capacitor.

3. The sense amplifier circuit of claim 1, wherein said integrator is bitline capacitance.

4. The sense amplifier circuit of claim 1, wherein said analog-to-digital converter comprises a clocked comparator.

5. The sense amplifier circuit of claim 1, wherein said digital-to-analog converter comprises a current source and a switch, said switch being controlled to switch in said current source in response to the digital average current.

6. The sense amplifier circuit of claim 1, wherein the memory cell comprises a flash memory cell.

7. The sense amplifier circuit of claim 1, wherein the memory cell comprises a floating gate device.

8. The sense amplifier circuit of claim 1, further comprising a counter for using the digital output.

9. A method of sensing a state of a memory cell, said method comprising the steps of:
   combining a memory cell current with a feedback average current to form a first output,
   integrating the first output to form a second output using an integrator, the integrator being charged and discharged during the integrating,
   converting the second output to a digital average current output, and
   using the digital average output to form and output the feedback average current,
   wherein the digital average output corresponds to a count of a number of times an integrator used to integrate the first output is discharged.

10. The method of claim 9, wherein said digital average current is fed to a counter.

11. The method of claim 9, wherein said digital average current is equivalent to said first output.

12. The method of claim 9, wherein said combining act is performed by summing the memory cell current with the feedback current.

13. The method of claim 9, wherein said act of converting the second output to a digital average current output is performed by comparing the output to a reference voltage.

14. The method of claim 9, wherein said memory cell current is flash cell current and said feedback average current is an average cell current.

15. A processor system comprising:
    a processor; and
    a memory device coupled to the processor, said memory device comprising a sense amplifier circuit comprising:
    a first circuit for summing a current from a memory cell and a feedback current to form a summed current;
    an integrator connected to receive the summed current and to integrate the summed current over a first time, said integrator being charged and discharged during the first time;
    an analog-to-digital converter connected to receive the integrated summed current and having a digital output corresponding to an average current and a count of a number of times said integrator is discharged during the first time; and
    a digital-to-analog converter connected to receive the digital average current and to output the feedback current to the first circuit.

16. The processor system of claim 15, wherein said integrator is a capacitor.

17. The processor system of claim 15, wherein said integrator is bitline capacitance.

18. The processor system of claim 15, wherein said analog-to-digital converter comprises a clocked comparator.

19. The processor system of claim 15, wherein said digital-to-analog converter comprises a current source and a switch, said switch being controlled to switch in said current source in response to the digital average current.

20. The processor system of claim 15, wherein the memory cell comprises a flash memory cell.

21. The processor system of claim 15, wherein the memory cell comprises a floating gate device.

22. The processor system of claim 15, further comprising a counter for using the digital output.

23. A memory device comprising:
    a flash memory cell; and
    a sense amplifier circuit connected to the cell, the sense amplifier circuit comprising:
    a first circuit for summing a current from a memory cell and a feedback current to form a summed current;
    an integrator connected to receive the summed current and to integrate the summed current over a first time, said integrator being charged and discharged during the first time;
    an analog-to-digital converter connected to receive the integrated summed current and having a digital output corresponding to an average current and a count of a number of times said integrator is discharged during the first time; and a digital-to-analog converter connected to receive the digital average current and to output the feedback current to the first circuit.

24. The memory device of claim 23, wherein said integrator comprises a capacitor.

25. The memory device of claim 23, wherein said integrator is bitline capacitance.

26. The memory device of claim 23, wherein said analog-to-digital converter comprises a clocked comparator.

27. The memory device of claim 23, wherein said digital-to-analog converter comprises a current source and a switch, said switch being controlled to switch in said current source in response to the digital average current.

28. The memory device of claim 23, wherein the memory cell comprises a flash memory cell.

29. The memory device of claim 23, wherein the memory cell comprises a floating gate device.

30. The memory device of claim 23, further comprising a counter for using the digital output.

31. A memory device comprising:

an array of flash memory cells; and a sense amplifier circuit connected to a column of said flash memory cells, the sense amplifier circuit comprising:

a first circuit for summing a current from a memory cell and a feedback current to form a summed current;

an integrator connected to receive the summed current and to integrate the summed current over a first time, said integrator being charged and discharged during the first time;

an analog-to-digital converter connected to receive the integrated summed current and having a digital output corresponding to an average current and a count of a number of times said integrator is discharged during the first time; and a digital-to-analog converter connected to receive the digital average current and to output the feedback current to the first circuit.

32. The memory device of claim 31, wherein said integrator comprises a capacitor.

33. The memory device of claim 31, wherein said integrator is bitline capacitance.

34. The memory device of claim 31, wherein said analog-to-digital converter comprises a clocked comparator.

35. The memory device of claim 31, wherein said digital-to-analog converter comprises a current source and a switch, said switch being controlled to switch in said current source in response to the digital average current.

36. The memory device of claim 31, wherein the array of memory cells comprises an array of flash memory cells.

37. The memory device of claim 31, wherein the array of memory cells comprises floating gate devices.

38. The memory device of claim 31, further comprising a counter for using the digital output.

39. The memory device of claim 31, further comprising a plurality of sense amplifier circuits connected to each of said flash memory cells.

\* \* \* \* \*